(12) United States Patent
Sayeh et al.

(10) Patent No.: US 7,355,538 B2
(45) Date of Patent: Apr. 8, 2008

(54) BINARY DELTA-SIGMA MODULATOR

(76) Inventors: Mohammad R. Sayeh, 38 Lake Indian Hills Ridge, Carbondale, IL (US) 62902; Azad Siahmakoun, 129 Lakeshore, Terre Haute, IN (US) 47803

( * ) Notice: Subject to any disclaimer, the term of this patent is extended or adjusted under 35 U.S.C. 154(b) by 0 days.

(21) Appl. No.: 10/578,056

(22) PCT Filed: Nov. 10, 2004

(86) PCT No.: PCT/US2004/037724

§ 371 (c)(1), (2), (4) Date: Mar. 15, 2007

(87) PCT Pub. No.: WO2005/048458

PCT Pub. Date: May 26, 2005

(65) Prior Publication Data

US 2007/0182609 A1    Aug. 9, 2007

Related U.S. Application Data

(60) Provisional application No. 60/519,043, filed on Nov. 10, 2003.

(51) Int. Cl.
*H03M 3/00* (2006.01)

(52) U.S. Cl. .................. 341/143; 341/137; 341/155

(58) Field of Classification Search ........... 341/137
See application file for complete search history.

(56) References Cited

U.S. PATENT DOCUMENTS

| 6,118,396 | A | 9/2000 | Song | |
|---|---|---|---|---|
| 6,326,910 | B1* | 12/2001 | Hayduk et al. | 341/137 |
| 6,469,649 | B1* | 10/2002 | Helkey et al. | 341/155 |
| 6,525,682 | B2* | 2/2003 | Yap et al. | 341/137 |
| 6,781,533 | B2* | 8/2004 | Yap et al. | 341/143 |

FOREIGN PATENT DOCUMENTS

EP    0308826    3/1989

OTHER PUBLICATIONS

Shoop B. L. et al. "Optical Oversampled Analog-To-Digital Conversion" Applied Optics, Optical Society of America, Washington US vol. 31, No. 26, Sep. 10, 1992 pp.5654-5660.

Pace, P.E. et al. "Integrated Optical Sigma-Delta Modulators" Optical Engineering, Soc. of Photo-Optical Instrumentation Engineers. Bellingham, US, vol. 35, No. 7, Jul. 1996, pp. 1828-1836.

* cited by examiner

*Primary Examiner*—Khai M. Nguyen
(74) *Attorney, Agent, or Firm*—Bose McKinney & Evans LLP

(57) ABSTRACT

A modulator, including an integrator (118), a bistable device (110), an adder (102) and a feedback loop (116) is provided. A method for converting a continuous time signal to a binary signal is also provided.

21 Claims, 15 Drawing Sheets

BINARY DELTA-SIGMA MODULATOR

This application is the U.S. national phase under 35 U.S.C. § 371 of PCT International Application No. PCT/US2004/37724, which has an international filing date of Nov. 10, 2004, designating the United States of America, and claims the benefit of U.S. Provisional Patent Application No. 60/519,043, which was filed Nov. 10, 2003. The disclosures of each of these prior applications are hereby incorporated by reference herein.

TECHNICAL FIELD

The present invention relates to electronic and optical analog-to-digital converters. Further, the present invention relates to the application of delta-sigma modulators in analog-to-digital conversion.

BACKGROUND

Advances in digital and wireless technologies have led to a need for faster, higher resolution signal processing systems. Analog-to-digital converters, which are key components of signal processing systems, need to be capable of handling the conversion of high-speed analog signals, such as radio frequency (RF) signals, to digital form. For example, analog-to-digital converters (ADCs) with very high sampling frequencies will be required for high-speed medical and scientific instrumentation, image processing, and wireless communication systems including software-defined radio.

The ability to sample high-speed signals will enable their direct digital signal processing. This task has proved challenging due to the need for fast and reliable ADCs. Delta-sigma modulators have recently become more practical due to improvements in technology that allow for implementation of high oversampling rates. Nonetheless, while electronic ADCs have been developed that are as fast as 18 GHz (1-bit) and 10 GHz (5-bit), the fastest commercially available electronic ADC currently known is the ADS1605/1606, a 16-bit delta-sigma ADC with a 5 MHz sampling rate, made by Texas Instruments. In order to effectively over-sample high-speed signals such as RF signals in C-band, an ADC with a sampling rate of over 100 GHz is needed.

Recently, a device having an optical switching time of 1.5 ps has been demonstrated, as discussed in Nishizawa et al., *Ultrafast all optical switching by use of pulse trapping across zero-dispersion wavelength*, Optics Express 11(4) 359-365 (24 Feb. 2003), incorporated herein by this reference. This and/or similar devices show promise for optical implementations of delta-sigma modulators.

Conventional modulators produce bipolar output (1, −1). A difficulty with optical implementations is handling negative values. Existing optical implementations have used the interference of light beams to overcome this problem. The use of interferometric methods, however, presents stability problems due to the laser frequency and/or phase fluctuations and component vibration.

Another disadvantage of many conventional delta-sigma modulators is that they require sample-and-hold or similar devices, which slow the oversampling rate. A further disadvantage of existing delta-sigma modulators is that they are unable to adjust the input signal range, so that when a signal of interest is beyond the input signal range, the conventional delta-sigma modulator becomes unstable and is thus unable to modulate the signal.

Accordingly, there is still a need for faster electronic and/or optical ADCs with higher sampling frequencies.

SUMMARY

In accordance with the present invention, a modulator is provided. The modulator includes an adder, an integrator, a bistable device, and a feedback loop. The adder receives a first signal x(t), which is an analog or continuous-time signal. The first signal adds to the output of the modulator, y(t), via the feedback loop, to form a second signal z(t), which may also be referred to as a first intermediate signal. The second signal z(t) enters the integrator. The output from the integrator, a third signal q(t), is received by the bistable device. The third signal q(t) may also be referred to as the second intermediate signal. The bistable device produces the output signal, y(t). The output signal is a binary (0,1) signal. The binary signal is suitable for use by digital computers, computing devices, DSP chips, or other digital devices.

In alternative embodiments, the modulator is an all-electronic device or an all-optical device. The integrator is a "leaky" integrator in the illustrated embodiments. Further, in the illustrated embodiments, the transfer function of the leaky integrator is:

$$\frac{g}{s+1/\tau}$$

where g is the gain coefficient and $\tau$ is the characteristic time of the leaky integrator. Also in certain of the illustrated embodiments, the bistable switch is an inverted bistable switch. Further, in the illustrated embodiments, a sample-and-hold or similar device is not required.

In the illustrated embodiments, the modulator is configured to operate with non-negative signals. In certain of these embodiments, the modulator has a positive feedback loop.

In certain embodiments, the modulator is an all-optical system. Certain of these embodiments are non-interferometric optical implementations. In one such embodiment, the first signal x(t) modulates a light signal, e.g., from a laser diode. Illustratively, an electro-optic modulator is used. The modulated light signal is added to the output of the modulator, y(t), to produce the second signal z(t). The second signal z(t) is received by a leaky integrator. The output of the leaky integrator, q(t), is received by a bistable device. The output of the bistable device, y(t), is a binary signal.

In certain embodiments, the all-electronic or all-optical modulator is coupled to a computing device running an adaptive control algorithm that modifies the parameters of the modulator to optimize performance. Such parameters that are modified, in alternative embodiments, include the sampling frequency and the input signal range. For example, in one embodiment, adaptive control is used to set the sampling frequency to any desired rate. In another embodiment, adaptive control is used to adjust the input signal range to accommodate signals outside the initial range. Adjustment of these and/or other parameters is used to improve system performance. For example, in one embodiment, adaptive control is used to adjust system parameters to accommodate a highly noisy environment by reducing high frequency noise. Alternatively or in addition, adaptive control is used to reduce the power consumption requirements of the ADC.

In alternative embodiments, the modulator includes one or more multi-level bistable devices, and/or one or more adders and leaky integrators. In other embodiments, the modulator includes a delay in the feedback loop or a leaky integrator in the feedback loop. In still other embodiments, the demodulator includes a low-pass filter.

Also in accordance with the present invention, a method of converting a continuous-time signal to a binary signal is provided. The method includes the steps of receiving a continuous time signal, adding a binary signal to the continuous time signal to produce a first intermediate signal, processing the first intermediate signal through an integrator to produce a second intermediate signal, and processing the second intermediate signal through a bistable device to produce the binary signal. In an alternative embodiment, the method further includes the step of modulating a light signal with the continuous-time signal. In another embodiment, the method further includes the step of adjusting the gain of the second intermediate signal prior to processing by the bistable device. In a further embodiment, the binary signal is detected by a photodiode.

BRIEF DESCRIPTION OF THE DRAWINGS

FIG. 9b is a graph of the transfer characteristics of the device shown in FIG. 9a;

DETAILED DESCRIPTION

Figure 1:
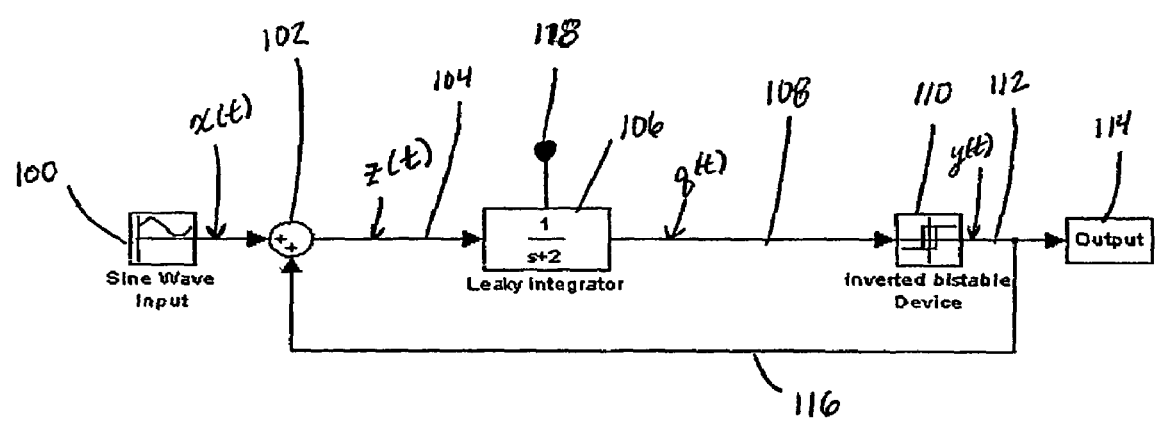
FIG. 1 is a block diagram of one embodiment of a delta-sigma modulator in accordance with the present invention.

A binary delta-sigma modulator in accordance with the present invention is shown in FIG. 1. The illustrated embodiment includes an adder 102, an integrator 106, a bistable device 110 and a feedback loop 116. In alternative embodiments, an output device 114 and/or adaptive control module 118 are also included. An analog or continuous-time signal is shown as the input signal x(t) at block 100. In the illustrated embodiment, a sinusoidal signal is used for the input, however, it is understood that any other kind of analog or continuous-time signal may be used.

The input signal x(t) is received by adder 102. Adder 102 also receives the output of the modulator, y(t), via feedback loop 116. Adder 102 adds the input signal x(t) and the output signal y(t) to form a first intermediate signal z(t). The first intermediate signal z(t) is received by integrator 106 via connection 104. Integrator 106 produces a second intermediate signal q(t). The second intermediate signal q(t) is received by bistable device 110 via connection 108. Bistable device 110 produces a binary (0 or 1) output signal y(t). The binary output signal y(t) is fed back to adder 102 via junction 112 and feedback loop 116. Output device 114 provides the binary output signal y(t) to other devices, such as computers, computing devices, etc. In one embodiment, output device includes a suitable low-pass filter as is well known in the art.

Adder 102 is any suitable adder known by those of ordinary skill in the art, for example, a fiber-optic coupler.

In the illustrated embodiment, integrator 106 is a "leaky" integrator. The output of the "leaky" integrator decays over time ($\tau$ is finite) while in a "normal" integrator $\tau=\infty$. The transfer function of the illustrated integrator 106 is:

$$\frac{g}{s+1/\tau}$$

where s is the Laplace transform variable, g is the gain coefficient of the integrator (in practice, in optical implementations, it will be the gain coeff. of an optical amplifier) and $\tau$ is the characteristic time of the leaky integrator.

The parameters g and $\tau$ are constants of the integration. In the illustrated embodiments, these parameters are selected so that the input signals will always be nonnegative values, and the modulator therefore operates with nonnegative input signals.

Figure 9A:
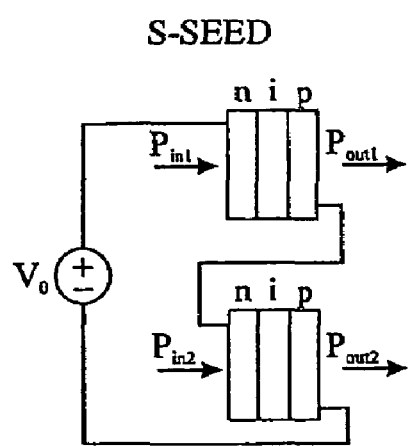
FIG. 9a is a schematic of a bistable device suitable for use in the embodiment of FIG. 5.
Figure 9B:
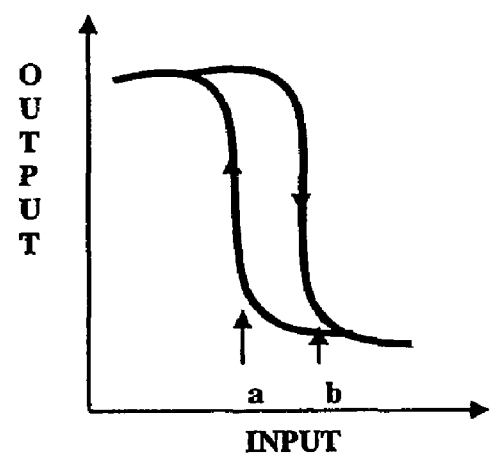

The adaptive feature of the modulator can be seen in the computable relationships between the input signal range and the sampling interval to the modulator parameters. The input signal range is described by three parameters: the lower limit $x_L$, the upper limit $x_U$, and the sample interval $\Delta t$. These parameters are related to the modulator parameters as $$x_L = \frac{b}{\tau g} - 1, \quad x_U = \frac{a}{\tau g}$$

$$\Delta t = \tau \ln\left[\frac{b-a+\tau g}{a-b+\tau g}\right]$$

where a is the switch-ON value of the input in the transfer function of the bistable switch and b is the switch-OFF value of the input in the transfer function of the bistable switch as illustrated in FIG. 9B. It is interesting to note that the sampling interval can be shorter than the time constant of the modulator τ for a high value of the gain parameter g or when a=b. Having a nonnegative value for the input signal imposes an upper limit for the gain value as $$\frac{b-a}{\tau} \le g \le \frac{a+b}{\tau}$$

Therefore the minimum reachable sampling interval is $$\Delta t_{min} = \tau \ln\left(\frac{b}{a}\right).$$

However, there is a possibility of reducing the overall delay, which includes the loop delay, to zero, by introducing a so-called backward-hysteresis inverted bistable device, in which b<a. See Jewell, Gibbs, et al, Appl. Phys. Lett. Vol. 40, pp. 291 (1982), incorporated herein by reference.

For example, in one embodiment, g=1, and τ=0.5. With these values, the transfer function becomes:

$$\frac{1}{s+2}.$$

In this case, integrator 106 will produce an intermediate signal q(t) having a positive value. In the illustrated embodiment, bistable device 110, in an electronic implementation, is any suitable inverted bistable switch known by those of ordinary skill in the art, such as a Schmidt Trigger. Bistable device 110 receives intermediate signal q(t) via connection 108 and outputs binary signal y(t), which has a value of either zero or one (0, 1).

Connections 104, 108, and 116 are suitable connections for transmitting electronic or optical signals that are well known in the art, such as copper wire or fiber-optic cable.

Figure 2:
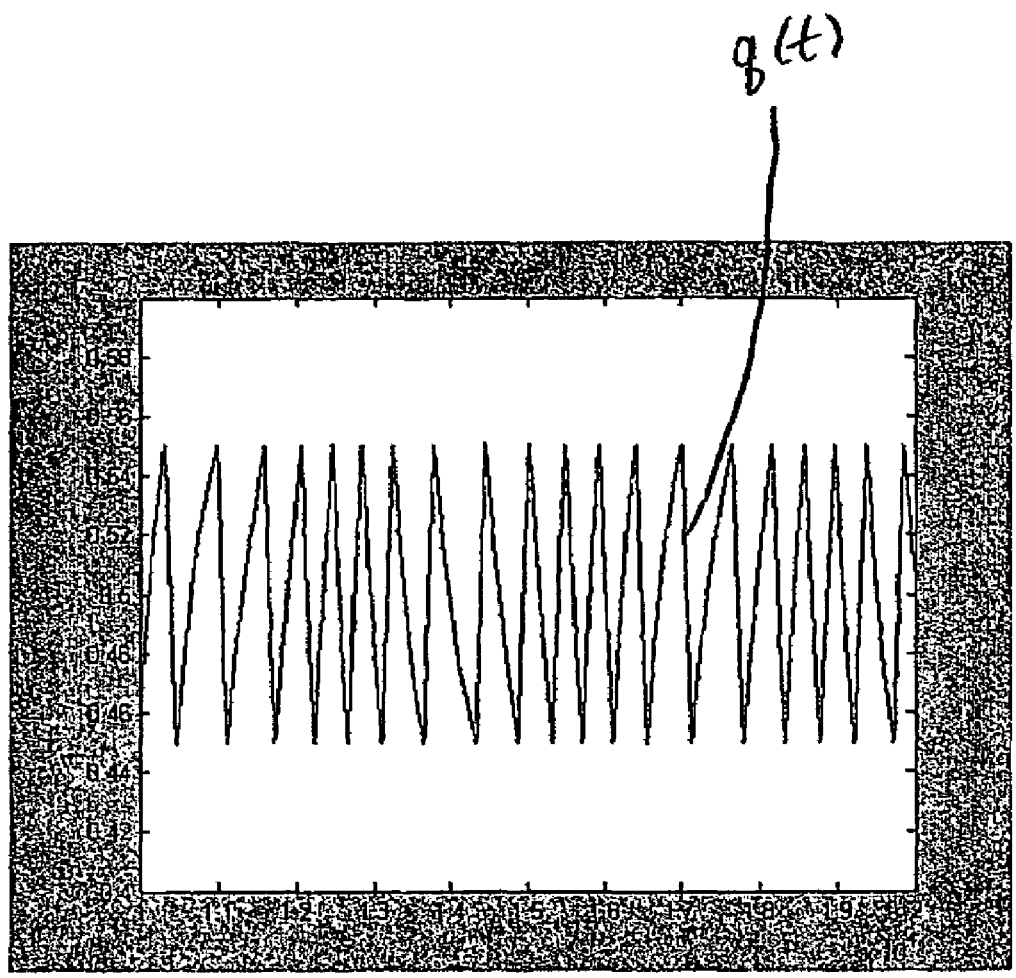
FIG. 2 is a graph showing an example of the signal q(t) output from the integrator in the embodiment shown in FIG. 1.

FIG. 2 shows a graph of a typical example of an intermediate signal q(t), output from integrator 106 in response to a short time portion of a sinusoidal input signal x(t). The x-axis is time and the y-axis is the detected optical power in volts.

Figure 3A:
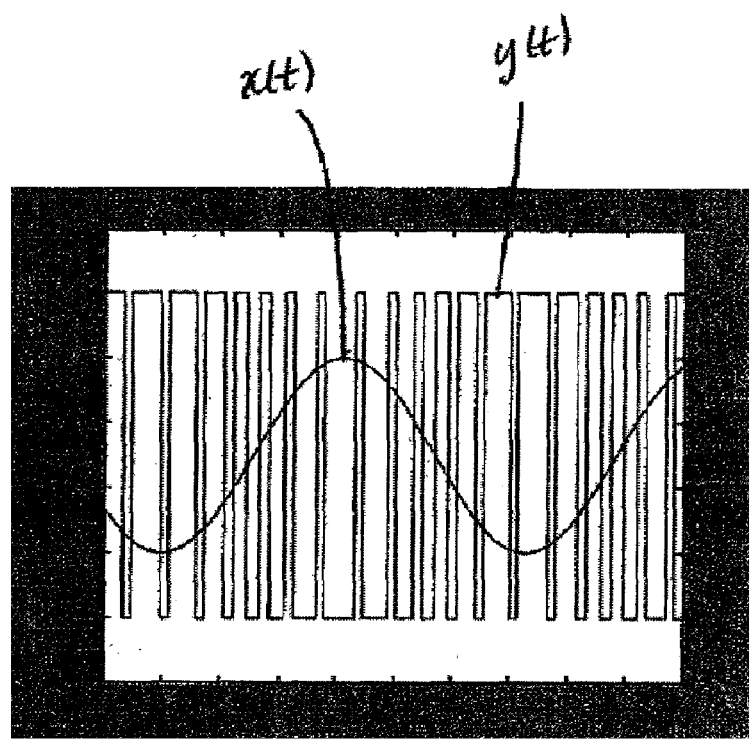
FIG. 3a is a graph showing an example of the signal y(t) output from the modulator illustrated in FIG. 1.
Figure 3B:
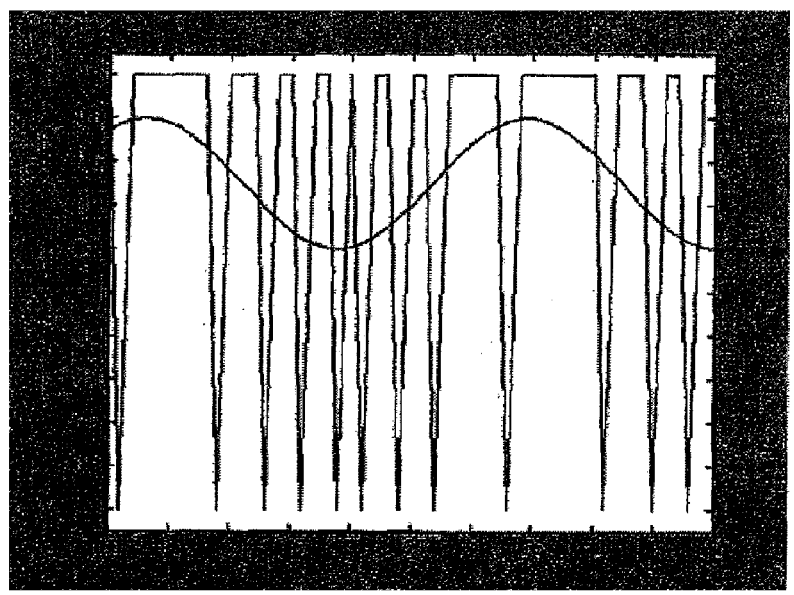
FIG. 3b is a graph showing an example of an output signal from a conventional bipolar delta-sigma modulator.

FIG. 3a is a graph showing an example of the corresponding output signal y(t) superimposed on the input signal x(t). The value of output signal y(t) is either 0 or 1 in FIG. 3a. For comparison, the modulated output from a conventional delta-sigma modulator is shown superimposed on the input signal, in FIG. 3b. The output of the conventional delta-sigma modulator is either −1 or 1, as shown in FIG. 3b. Again, the x-axis is time and the y-axis is the detected optical power in volts.

Figure 4A:
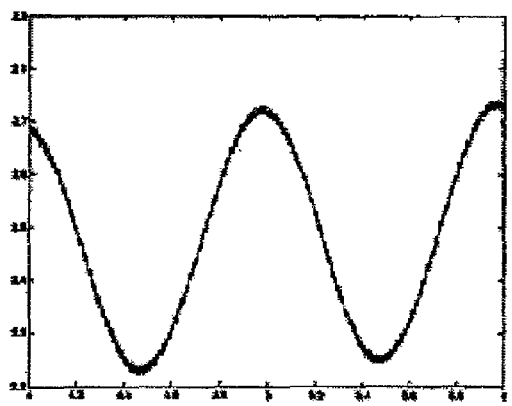
FIG. 4a is a graph showing an example of an output signal y(t) from the modulator illustrated in FIG. 1, demodulated via a low-pass filter.
Figure 4B:
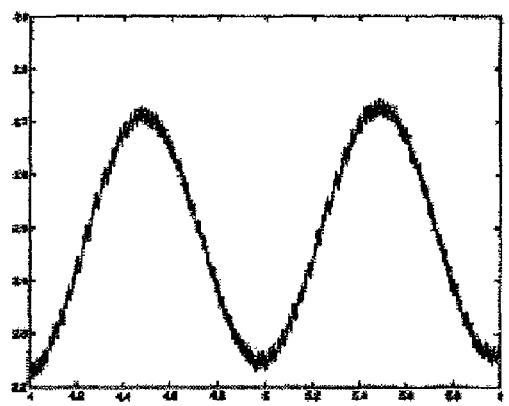
FIG. 4b is a graph showing an example of an output signal from a conventional bipolar delta-sigma modulator, demodulated via a low-pass filter.

In either case, the output signals are easily demodulated using a simple low-pass filter, as is well known in the art. A graph of the demodulated output signal y(t) of the illustrated embodiment is shown in FIG. 4a. For comparison, the demodulated output from the conventional delta-sigma modulator is shown in FIG. 4b. The π phase shift is due to the inverted bistable device 110 used in the illustrated embodiment of the present invention. The RMS (root-mean-square) values (in volts) of the noise introduced in the demodulated signal in each case suggest that the performance of the illustrated embodiment of the present invention is better than that of the conventional delta-sigma modulator.

Referring back to FIG. 1, one or more embodiments of the present invention include an adaptive control module 118. Adaptive control module 118 includes a conventional or intelligent control algorithm well-known in the art, such as a wavelet, neural network, or fuzzy logic algorithm. See, for example, *Advanced Methods in Neural Computing*, P. D. Wasserman, Van Nostrand Reinhold, New York, 1993, incorporated herein by reference.

The adaptive control module 118 resides on a suitable computer or computing device (such as a handheld device) known in the art. Adaptive control module 118 does not require a high-speed processor due to the slow characteristic of the environmental variations. In other words, changes in the physical world are typically happening at much lower rates than the electronics response and/or their processing time.

The input to adaptive control module 118 are signals from sensors indicating the frequency response and/or the dynamic range needed for some prescribed performance measures of the modulator. The output of adaptive control module 118 modifies the parameters (e.g., g and τ) of the modulator in order to optimize its performance. This is done, for example, by increasing the oversampling rate which in turn increases the ADC's resolution.

Figure 5:
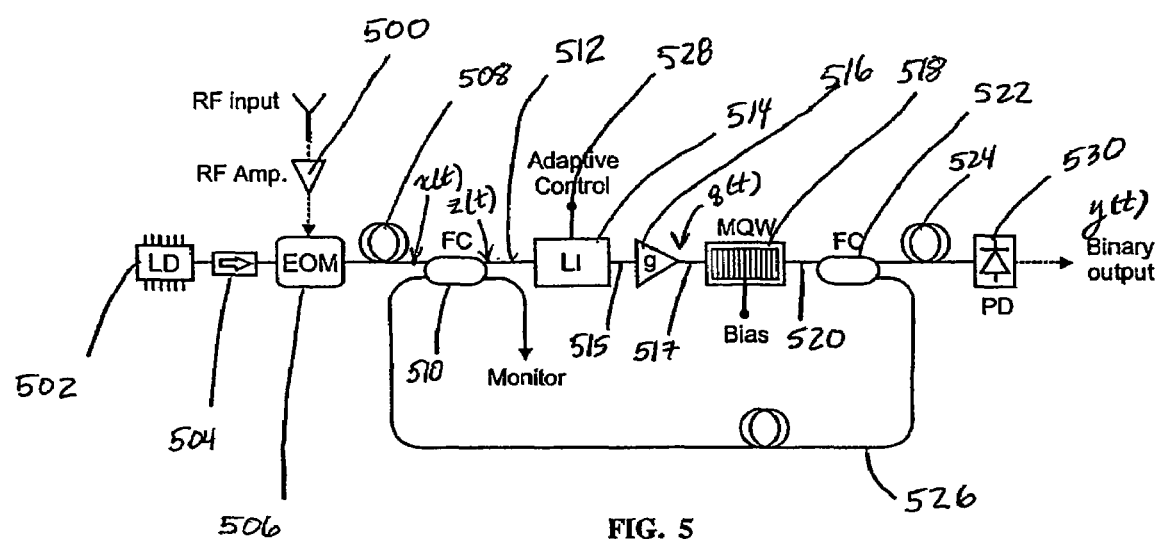
FIG. 5 is a block diagram of one embodiment of an all-optical implementation of a delta-sigma modulator in accordance with the present invention.

FIG. 5 shows the layout of an all-optical implementation of the present invention. The embodiment of FIG. 5 is configured to receive an RF signal as input, however, it is understood that any other analog or continuous-time signal may be used as input.

The embodiment shown in FIG. 5 includes an RF amplifier 500, a laser diode 502, an electro-optic modulator 506, a first fiber-optic coupler 510, an integrator 514, an optical gain amplifier 516, a bistable device 518, a second fiber-optic coupler 522, a feedback loop 526, a photodiode 530, an optical isolator 504, and connections, 508, 512, 515, 517, 520 and 524. Alternative embodiments further include an adaptive control module 528.

An input RF signal is amplified by RF amplifier 500 and input into electro-optic modulator 506. Electro-optic modulator 506 also receives a light signal from laser diode 502 via optical isolator 504. The amplified RF signal modulates the light from laser diode 502 via electro-optic modulator 506. The modulated light x(t) enters fiber-optic coupler 510 via connection 508. Fiber-optic coupler 510 functions as an adder as it combines the modulated light x(t) with the binary output y(t) received via feedback loop 526 and outputs a first intermediate signal z(t).

The first intermediate signal z(t) is received by integrator 514 via connection 512. Integrator 514 outputs an integrated signal. The integrated signal enters an optical amplifier 516 via connection 515. Optical amplifier 516 adjusts the gain of the integrated signal to produce a second intermediate signal, q(t). The amplified integrated signal q(t) enters bistable device 518 via connection 517. Bistable device 518 performs a thresholding function, generating a binary output y(t). Binary output y(t) is detected by photodiode 530 via connection 524. Binary output y(t) is also fed back to integrator 514 via second fiber-optic coupler 522, feedback loop 526, and first fiber-optic coupler 510, for the continuous operation of the system.

In alternative embodiments, adaptive control module 528 operates to adjust parameters of the system in a similar manner as discussed above.

In the illustrated embodiment, any suitable RF amplifier 500, laser diode 502, electro-optic modulator 506, fiber-optic couplers 510 and 522, photodiode 530, as are well known in the art, may be used. These components are readily found as part of telecom technologies. Connections 504, 508, 512, 515, 517, 520 are glass or plastic fibers, or other fiber-optic cable or similar suitable medium for the transmission of light known in the art.

Integrator 514 is a leaky integrator. Suitable devices for use as leaky integrator 514 include, for example, a fiber-optic Fabry-Perot, a photorefractive time integrator, and a fiber-lattice structure.

Figure 6:
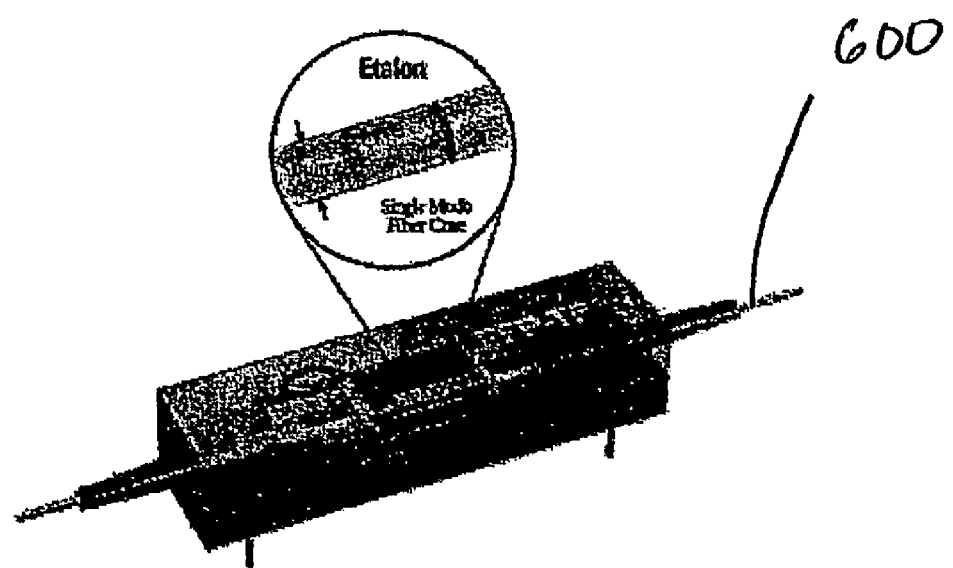
FIG. 6 is a picture of an integrator suitable for use in the embodiment of FIG. 5.

An example of a tunable Fabry-Perot (FP) suitable for use as leaky integrator 514 is shown in FIG. 6. Suitable FPs are made by Micron Optics Technology, located at 1852 Century Place NE, Atlanta, Ga. 30345. In brief, an optical fiber 600 functions as an etalon and guides the light between the reflective ends (e.g., two independent mirrors) of the FP. With each bounce the laser light leaks out and thus the total light between the reflective ends decays in time. This exponential decay of optical density is in analogy with the leaky integrator function described above. The tunability of the FP etalon can be used to adapt the illustrated embodiment to accommodate various RF bands.

The high degree to which a Fabry-Perot etalon follows the Airy Function theory means that optical systems can be designed to exhibit predictable cross-talk, highly accurate power measurements, high optical signal-to-noise ration (SNR), and excellent wavelength selectivity.

Figure 7:
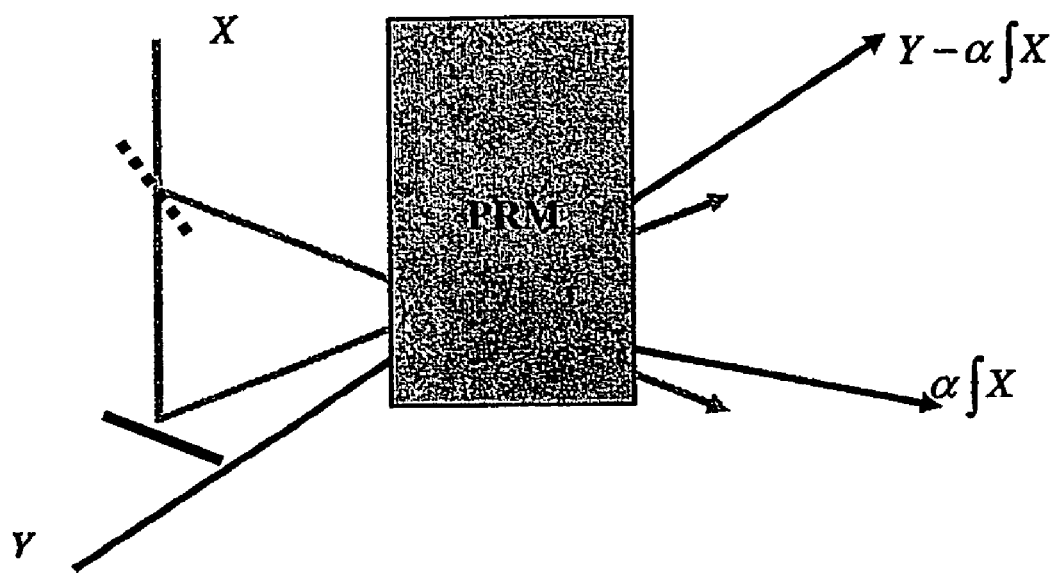
FIG. 7 is a schematic of another integrator suitable for use in the embodiment of FIG. 5.

Another suitable device for use as a leaky integrator in the illustrated embodiment is a photorefractive time integrator. A suitable photorefractive time integrator is constructed using a photorefractive material and a two-wave coupling process as shown in FIG. 7. The process of recording in a photorefractive material (PRM) requires photo absorption. A photorefractive grating (an index modulation) is formed by interfering two coherent beams inside a PRM.

If a laser beam at port X is split to form a grating in PRM. The dynamics of the grating would be proportional to the time integral of the input signal. In order to have a better signal-to-noise ratio, a zero-bias integration is achieved by reading the grating through diffraction of a second laser beam at port Y. This integration technique has been demonstrated for RF signals with a center frequency of 70 MHz using a BSO crystal, as described in Psaltis et al., *Bias-free time-integrating optical correlator using a photorefractive crystal*, Applied Optics 24(22) 3860-3865 (15 Nov. 1985), which is incorporated herein by reference. Using other fast crystals such as GaAs with ps response time, it is possible to reach GHz signal integration, as discussed in L. Solymar et al., *The Physics and Applications of Photorefractive Materials* (Clarendon Press 1996), incorporated herein by reference.

Figure 8:
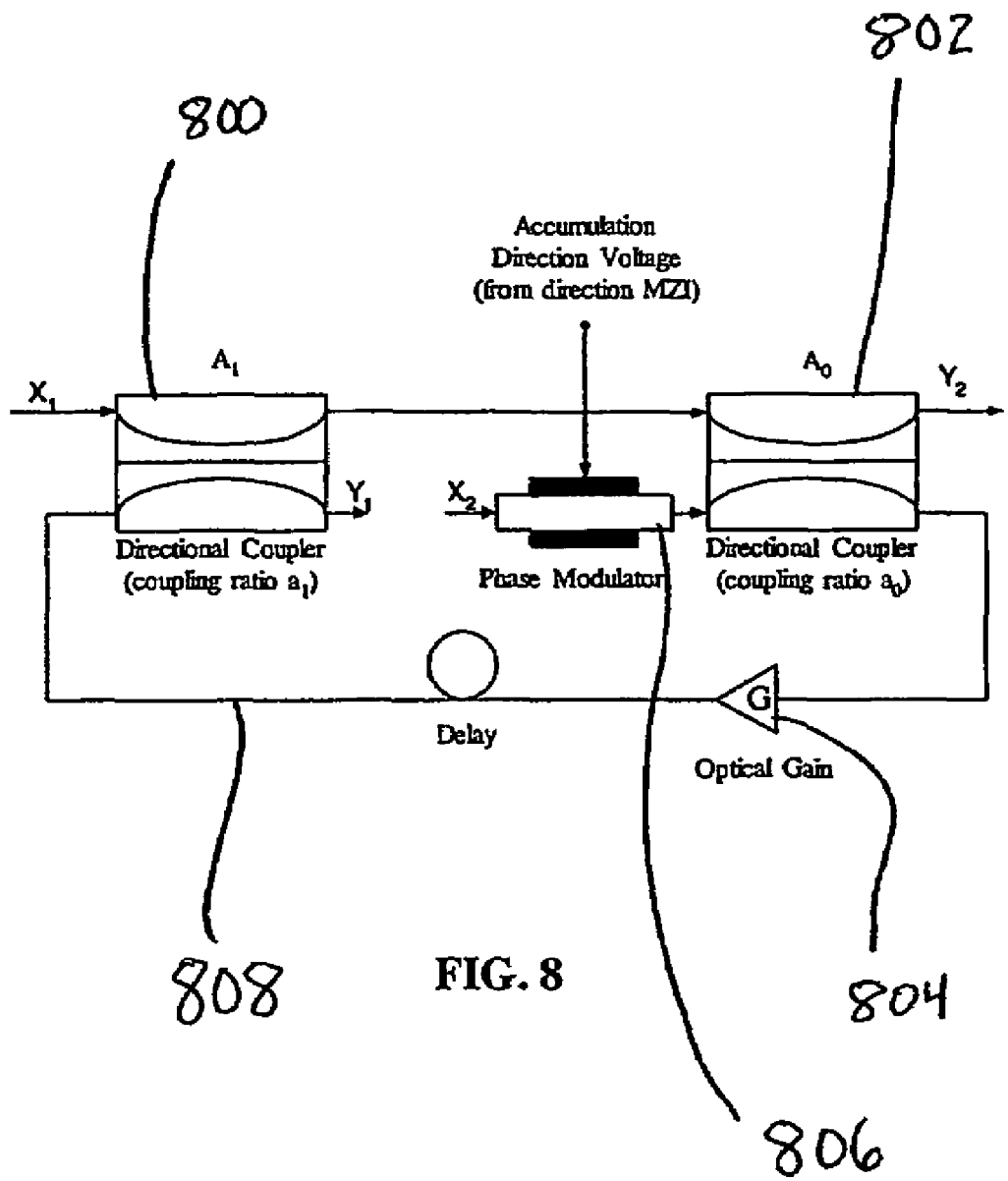
FIG. 8 is a block diagram of another integrator suitable for use in the embodiment of FIG. 5.

A fiber-lattice accumulator designed using a recoupling phase modulator is another suitable device for use as integrator 514. A block diagram of a four-port fiber-lattice architecture is shown in FIG. 8 and described in Pace et al., *Fiber-lattice accumulator design considerations for optical sigma-delta analog-to-digital converters*, Opt. Eng. 39(6) 1517-1526 (June 2000), which is incorporated herein by reference.

Briefly, a suitable fiber lattice structure consists of two directional couplers 800 and 802, an optical amplifier 804, a phase modulator 806, and a delay line 808 due to the length of a recirculating fiber. Directional couplers 800, 802 have coupling ratios $a_0$ and $a_1$. G is the gain associated with the optical amplifier 804. X1 and X2 are the input ports and Y1 and Y2 the output ports of the fiber lattice structure.

Referring back to FIG. 5, bistable device 518 is a thresholding device that performs optical bistability and thus the quantization function of the ADC. In general, in the illustrated embodiment, bistable device 518 is an inverted bistable optical switch. Suitable devices for use as bistable device 518 include a multiple quantum well (MQW) devices such as a semiconductor saturable absorber mirror (SESAM) device.

Multiple quantum well (MQW) devices are alternating layers of two semiconductors. Typically, these MQW devices are grown using molecular beam epitaxy (MBE) techniques. For the charge carriers this is a quantum confinement with discrete energies and strong absorption peaks (exciton peaks) at the edge of the well. An applied electric field will tilt the energy band which in turn results a red shift in the absorption peak known as quantum confined Stark effect (QCSE). This shift changes the optical absorption at a given wavelength and is the foundation of the electroabsorptive or QCSE modulators. Operating QCSE modulators at an unstable point leads to bistable behavior by the device.

One type of suitable MQW device for use in the embodiment of FIG. 5 is a self-electro-optic effect device (SEED), described in Miller, *Novel Analog Self electrooptic-Effect Devices*, IEEE Journal of Quantum Electronics 29(2) 678-697 (February 1993) and Boyd et al., 33 *ps Optical Switching of Symmetric Self-electro-optic Effect Devices*, Appl. Phys. Lett. 57(18) 1843-1845 (29 Oct. 1990), both of which are incorporated herein by this reference. A schematic of a suitable SEED device is shown in FIG. 9a. FIG. 9a shows two cascaded-MQW devices refer to as symmetric SEED. The responsivity of the device decreases with increasing applied voltage. As the voltage bias is increased the absorption decreases (transmission increases). Only the ratio of the two input powers determines the operating point. This device is bistable for $P_{out1}$ (optical power of the output 1) versus $P_{inc1}$, (optical power in incident beam 1). A graph of the corresponding transfer function is presented in FIG. 9b. As discussed in the above-cited references, a switching time of 30-50 ps and minimum switching energy of 10 pJ has been reported with such devices.

Another device suitable for use as bistable device 514 is a semiconductor saturable absorber mirror (SESAM) device, an example of which is described in Keller et al., *Semiconductor Saturable Absorber Mirrors (SESAM's) for Femtosecond to Nanosecond Pulse Generation in Solid-State Lasers*, IEEE Journal of Selected Topics in Quantum Electronics 2(3) 435-453 (September 1996), which is incorporated herein by this reference. SESAM is attractive in ultra short optical pulse generation and other optical switching applications, in large part due to the advent of the bandgap engineering and modern semiconductor growth technology. The performance parameters of the SESAM are its absorption recovery time, saturation fluence, absorption wavelength and modulation depth. These parameters can be controlled very accurately. SESAM devices have been shown to be capable of picosecond and femtosecond optical short pulse generation.

Figure 10:
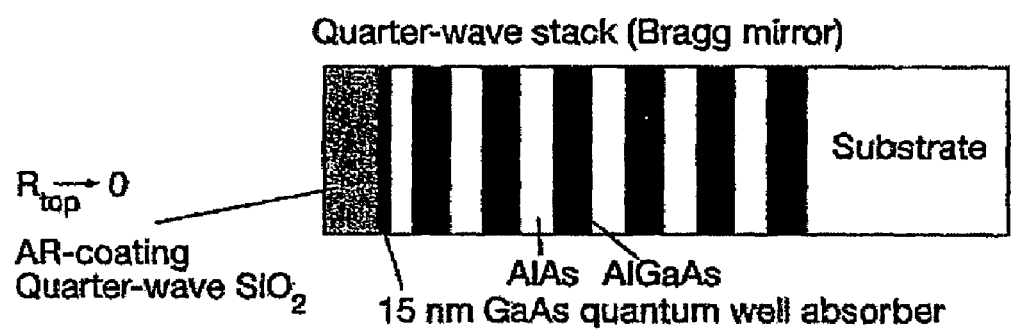
FIG. 10 is a typical structure of another bistable device suitable for use in the embodiment of FIG. 5.

FIG. 10 shows a typical structure of an AR-coated SESAM. The SESAM includes an AlAs-AlGaAs Bragg Mirror with a single GaAs Quantum-well absorber and in its last quarter wavelength thickness AlAs layer of Bragg reflector. An additional anti-reflection (AR) is required to prevent Fabry-Perot resonance. Using the incident laser mode area as an adjustable parameter, one can adapt the incident pulse energy density to the saturation fluence of the device. There are several different SESAM designs, including: high-finesse anti-resonant Fabry-Perot saturable absorber, low finesse and dispersion-compensating saturable absorber mirror.

Figure 11:
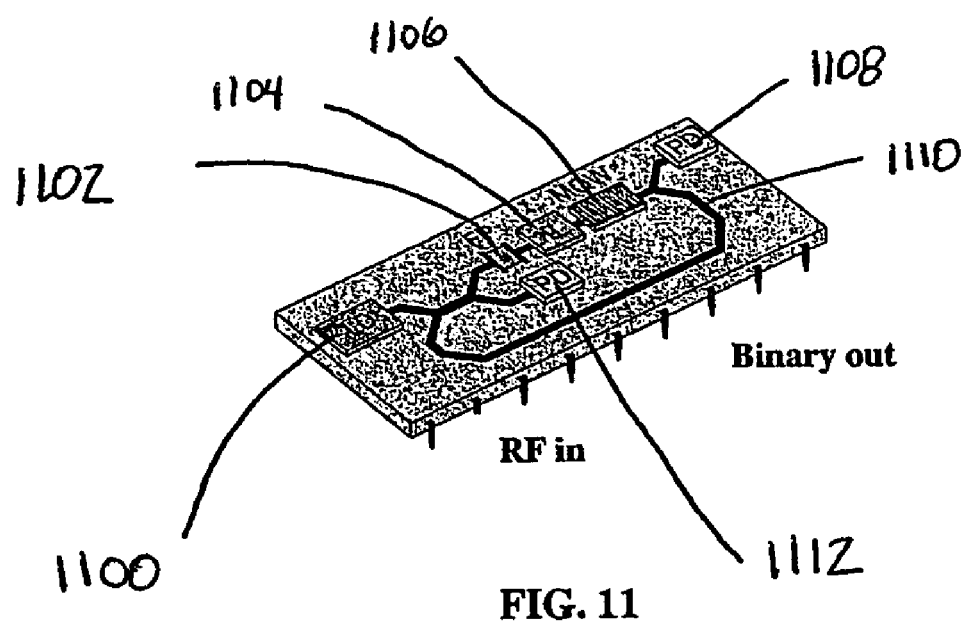
FIG. 11 is a block diagram of one embodiment of an optoelectronic delta-sigma modulator in accordance with the present invention.

FIG. 11 shows a schematic of one embodiment of an optoelectronic binary delta-sigma modulator chip in accordance with the present invention (a monolithic example). Shown in the embodiment of FIG. 11 are modulated laser diode 1100, integrator 1102 (an FP device), optical amplifier 1104, bistable device 1106 (an MQW device), photodiodes 1108 and 1112, and connection 1110.

It is possible to model, design and fabricate an optoelectronic chip to implement the present invention that would contain all optical components and electronic ports on a single monolithic chip. A prototype of such a chip using the state-of-the-art semiconductor fabrication technology not only reduces cost, weight, size and power consumption of the ADC but also enhances the frequency bandwidth and response of the device.

The embodiments discussed above are simple one-bit first-order modulators. This architecture is extended to multi-bit and higher order modulators in alternative embodiments. FIGS. 12, 13, 14, and 16 show block diagrams of other alternative embodiments of binary delta-sigma modulators in accordance with the present invention.

Figure 12:
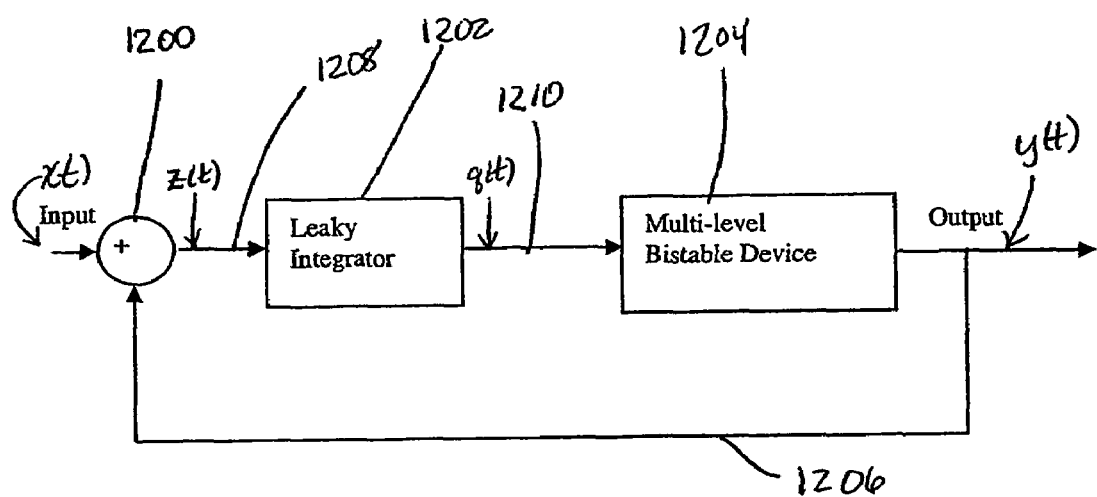
FIG. 12 is a block diagram of an alternative embodiment of the multi-bit modulator in accordance with the present invention.

A multi-bit modulator in accordance with the present invention is shown in FIG. 12. The embodiment of FIG. 12 includes an adder 1200, a leaky integrator 1202, a multi-level bistable device 1204 and a feedback loop 1206. A continuous-time or analog input signal x(t) enters adder 1200. Binary output y(t) is added to input signal x(t) by adder 1200. Adder 1200 outputs first intermediate signal z(t). First intermediate signal z(t) is received by leaky integrator 1202 via connection 1208. Leaky integrator 1202 outputs a second intermediate signal q(t), which is received by multi-level bistable device 1204 via connection 1210. Multi-level bistable device produces binary output (0 or 1) for each bit of input. For a discussion of multi-level bistable devices, see T. Waho, K. J. Chen, and M. Yamamoto, "Resonant-Tunneling Diode and HEMT logic circuits with multiple thresholds and multi-level output," IEEE J. Solid-State Circuits, 33, pp. 268-274, February 1998, incorporated herein by reference. Each of the other components of the embodiment of FIG. 12 and suitable examples thereof are discussed above.

Figure 13:
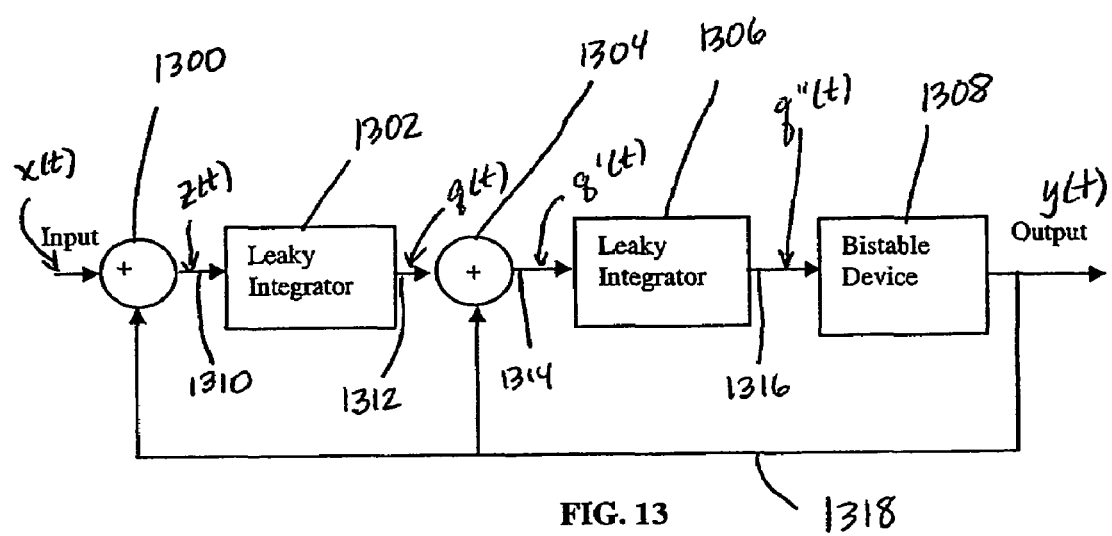
FIG. 13 is a block diagram of another alternative embodiment of the modulator in accordance with the present invention.

A second-order modulator in accordance with the present invention is shown in FIG. 13. The embodiment of FIG. 13 includes a first adder 1300, a first leaky integrator 1302, a second adder 1304, a second leaky integrator 1306, a bistable device 1308 and a feedback loop 1318. An analog or continuous-time input signal x(t) is received by the first adder 1300. First adder 1300 also receives binary output signal y(t) and adds it to input signal x(t). Adder 1300 outputs the first intermediate signal z(t), which is received by first leaky integrator 1302 via connection 1310.

First leaky integrator 1302 outputs the second intermediate signal q(t). Second intermediate signal q(t) is received by the second adder 1304 via connection 1312. Second adder 1304 also receives binary output signal y(t) and adds it to second intermediate signal q(t). Second adder 1304 outputs third intermediate signal q'(t), which is received by the second leaky integrator 1306 via connection 1314.

Second leaky integrator 1306 outputs fourth intermediate signal q''(t), which is received by bistable device 1308 via connection 1316. Bistable device outputs a binary signal y(t) (0 or 1). Each of the components of the embodiment of FIG. 13 and suitable examples thereof are discussed above.

In general, a binary delta-sigma modulator in accordance with the present invention is adaptable to different architectures. For example, the leaky integrator may have a general form of any accumulator with leak, including, but not limited to, linear as well as nonlinear combinations of the simple leaky integrator.

Figure 14:
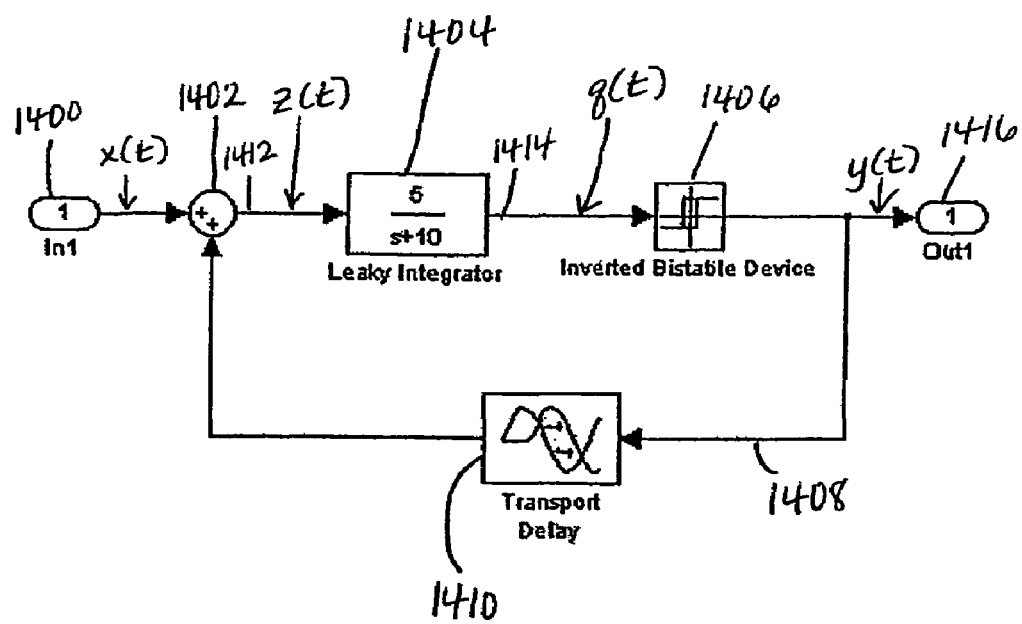
FIG. 14 is a block diagram of yet another alternative embodiment of the modulator in accordance with the present invention.
Figure 16:
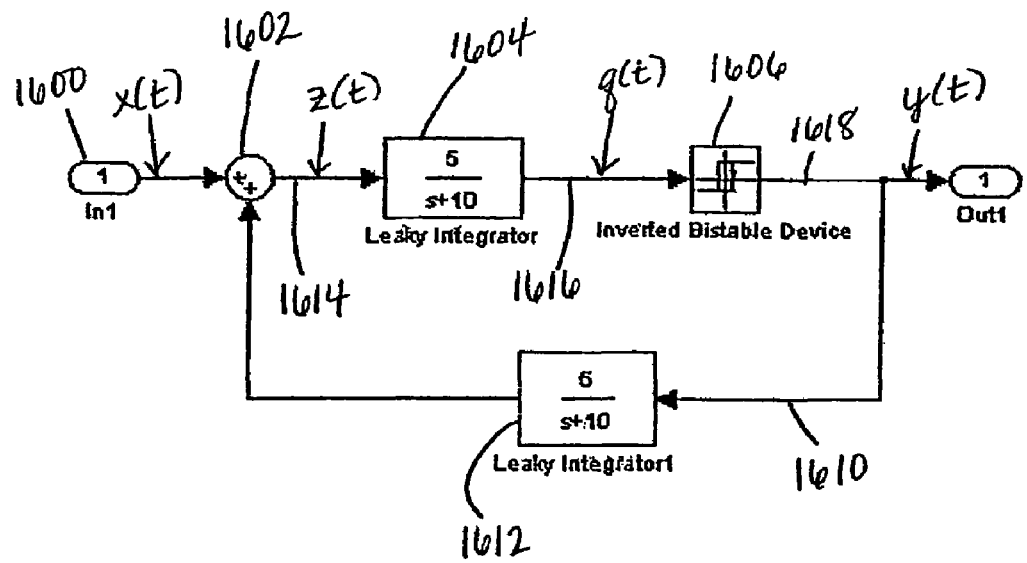
FIG. 16 is a block diagram of still another alternative embodiment of the modulator in accordance with the present invention.

Also, in other alternative embodiments, the modulator of the present invention includes delays in the feedback loop and/or additional leaky integrators. FIGS. 14 and 16 show examples of these alternative architectures, but they are not intended to be limiting. It will be understood by those skilled in the art that various other modifications may be made within the scope and spirit of the present invention.

FIG. 14 shows a block diagram of an alternative embodiment including a delay in the feedback loop. The embodiment of FIG. 14 includes an input device 1400, an adder 1402, an integrator 1404, a bistable device 1406, a feedback loop 1408, a delay 1410, connections 1412, 1414, and an output device 1416. This embodiment operates similarly to the other embodiments described above, except that delay 1410 causes a delay in transmission of output signal y(t) back to adder 1402. Accordingly, it represents a delay time that is associated with the feedback in practice. It is also a more practical representation of the architecture provided in FIG. 1. Note that in the embodiment shown in FIG. 14, g=5 and τ=0.1.

Figure 15:
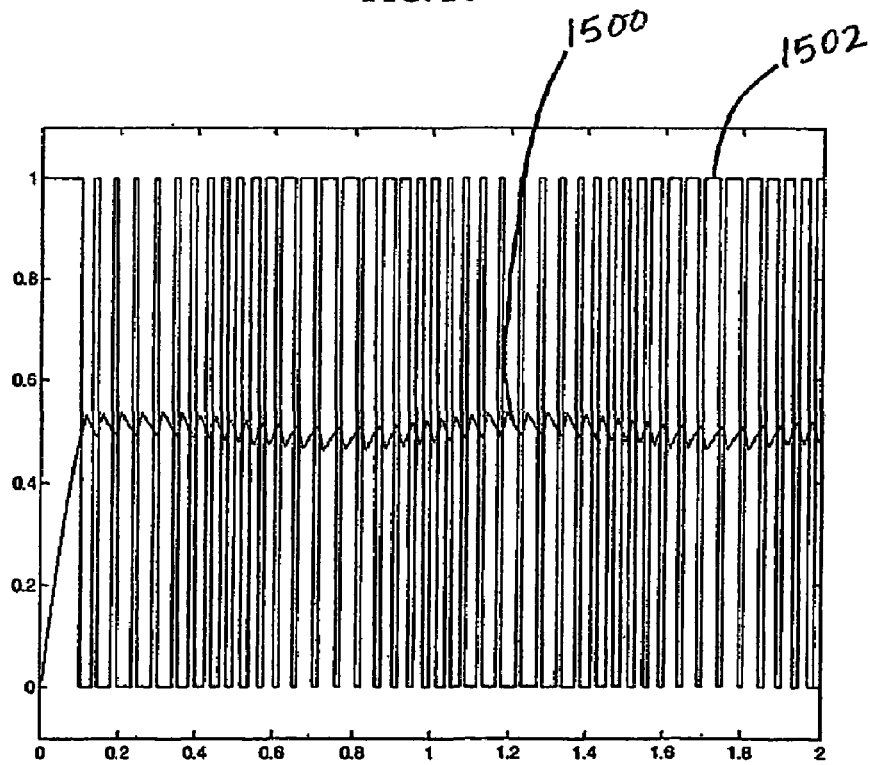
FIG. 15 is a graph showing an example of output from the embodiment of FIG. 14.

A graph of the output of a modulator corresponding to the embodiment of FIG. 14 is shown in FIG. 15. Line 1500 represents the output q(t) of the integrator 1404. Line 1502 represents the binary output y(t).

Another architecture includes one ore more leaky integrators in the feedback loop, as shown in FIG. 16. The embodiment of FIG. 16 includes an input device 1600, an adder 1602, a first integrator 1604, a bistable switch 1606, an output device 1608, a feedback loop 1610, a second integrator 1612, and connections 1614, 1616, and 1618. This embodiment operates similarly to the other embodiments described above, except that second integrator 1612 is provided in feedback loop 1610. As a result, it provides more control parameters for possibly a better performance. Note that in the embodiment shown in FIG. 15, g=5 and τ=0.1 in the transfer function of first integrator 1604 and g=5 and τ=0.5 in the transfer function of second integrator 1612. It is understood that any suitable transfer function may be used in first and second integrators 1604, 1612, including the same or different transfer function in each.

Figure 17:
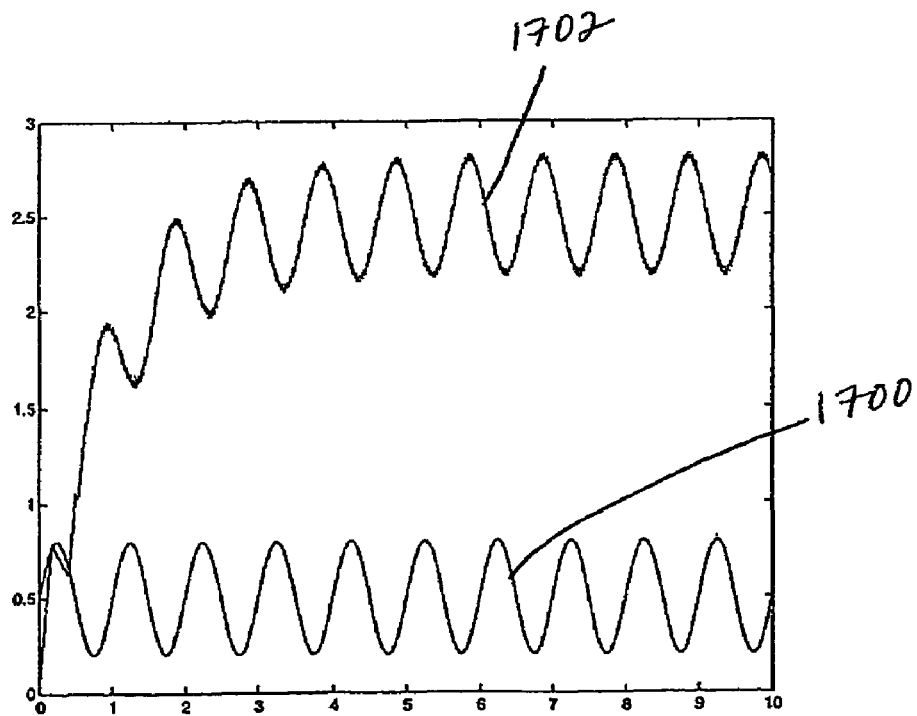
FIG. 17 is a graph showing an example of original input and demodulated output from the embodiment of FIG. 16.

FIG. 17 shows a graph of the sinusoidal input x(t) and corresponding output y(t) of a modulator of the embodiment of FIG. 16, after demodulation with a simple low-pass filter. Line 1700 represents the input signal x(t), and line 1702 represents the demodulated output y(t). FIG. 17 shows that, using the embodiment of FIG. 16, the demodulated output essentially matches the input after a transient period of time.

Although the present invention has been described in detail with reference to certain exemplary embodiments, it is understood that variations and modifications exist and are within the scope and spirit of the present invention.

The invention claimed is:

1. A modulator, comprising:
   an adder configured to add a first nonnegative continuous-time signal and a nonnegative binary output signal to form a first nonnegative intermediate signal, a leaky integrator operably coupled to the adder and configured to receive the first nonnegative intermediate signal and generate a second intermediate signal therefrom, an inverting bistable device operably coupled to the integrator and configured to receive the second intermediate signal, and generate the nonnegative binary output signal therefrom, and a feedback loop coupling the inverting bistable device and the adder to provide the nonnegative binary output signal to the adder.

2. The modulator of claim 1, wherein the modulator is an all-electronic device.

3. The modulator of claim 1, wherein the modulator is an all-optical device.

4. The modulator of claim 1, wherein the leaky integrator has a transfer function of $$\frac{g}{s+\frac{1}{\tau}}$$

where g is the gain coefficient and $\tau$ is a finite period of time.

5. A system, comprising the modulator of claim 1, and a computing device coupled to the modulator and being configured to adaptively modify parameters of the modulator to optimize performance.

6. The system of claim 5, wherein the computing device is configured to modify at least one of sampling frequency and input signal range.

7. The modulator of claim 1, further comprising at least one multi-level inverting bistable device.

8. The modulator of claim 1, wherein the feedback loop includes a delay.

9. A method for converting a continuous time signal to a binary signal, comprising the steps of:

receiving a nonnegative continuous time signal, adding a nonnegative binary output signal to the nonnegative continuous time signal to produce a first nonnegative intermediate signal, processing the first nonnegative intermediate signal through a leaky integrator to produce a second intermediate signal, and processing the second intermediate signal through an inverting bistable device to produce the nonnegative binary output signal.

10. The method of claim 9, further comprising the step of modulating a light signal with the nonnegative continuous time signal.

11. The method of claim 9, further comprising the step of adaptively adjusting at least one of input signal range and sampling interval.

12. A modulator comprising:

an amplifier configured to amplify a continuous-time signal, an optical isolator configured to receive a light signal, an electro-optic modulator coupled to the optical isolator and the continuous-time signal amplifier, the electro-optic modulator configured to receive the amplified continuous-time signal and modulate the light signal thereby, a first fiber-optic coupler configured to add the modulated light signal and a feedback signal, a leaky integrator configured to generate an integrated signal from output of the first fiber-optic coupler, an inverting bistable device configured to generate a binary signal from the integrated signal, and a second fiber-optic coupler coupled to the inverting bistable device configured to provide a binary output signal and the feedback signal.

13. The modulator of claim 12, wherein the leaky integrator is configured to provide exponential decay of optical density.

14. The modulator of claim 13, wherein the bistable device is a multiple quantum well device.

15. The modulator of claim 12, wherein the amplifier, the optical isolator, the fiber-optic couplers, the leaky integrator, the bistable device, and the feedback loop are contained on a single chip.

16. The modulator of claim 12, further comprising a second leaky integrator coupled to the bistable device.

17. A modulator, comprising:

an adder configured to add a first nonnegative continuous-time signal and a nonnegative binary output signal to form a first nonnegative intermediate signal, a leaky integrator operably coupled to the adder and configured to receive the first nonnegative intermediate signal and generate a second intermediate signal therefrom, wherein the leaky integrator has a transfer function of $$\frac{g}{s+\frac{1}{\tau}}$$

where g is the gain coefficient and $\tau$ is a finite period of time, an inverting bistable device operably coupled to the integrator and configured to receive the second intermediate signal, and generate the nonnegative binary output signal therefrom, and a feedback loop coupling the inverting bistable device and the adder to provide the nonnegative binary output signal to the adder.

18. A system, comprising:

an adder configured to add a first nonnegative continuous-time signal and a nonnegative binary output signal to form a first nonnegative intermediate signal, a leaky integrator operably coupled to the adder and configured to receive the first nonnegative intermediate signal and generate a second intermediate signal therefrom, an inverting bistable device operably coupled to the integrator and configured to receive the second intermediate signal, and generate the nonnegative binary output signal therefrom, a feedback loop coupling the inverting bistable device and the adder to provide the nonnegative binary output signal to the adder, and a computing device coupled to the modulator and being configured to adaptively modify parameters of the modulator to optimize performance.

19. The system of claim 18, wherein the computing device is configured to modify at least one of sampling frequency and input signal range.

20. A modulator, comprising:

an adder configured to add a first nonnegative continuous-time signal and a nonnegative binary output signal to form a first nonnegative intermediate signal, a leaky integrator operably coupled to the adder and configured to receive the first nonnegative intermediate signal and generate a second intermediate signal therefrom, an inverting bistable device operably coupled to the integrator and configured to receive the second intermediate signal, and generate the nonnegative binary output signal therefrom, and a feedback loop coupling the inverting bistable device and the adder to provide the nonnegative binary output signal to the adder, wherein the feedback loop includes a delay.

21. A method for converting a continuous time signal to a binary signal, comprising the steps of:

receiving a nonnegative continuous time signal, adding a nonnegative binary output signal to the nonnegative continuous time signal to produce a first nonnegative intermediate signal, processing the first nonnegative intermediate signal through a leaky integrator to produce a second intermediate signal, and processing the second intermediate signal through an inverting bistable device to produce the nonnegative binary signal, and adaptively adjusting at least one of input signal range and sampling interval.

* * * * *